US005244533A

United States Patent [19]
Kimura et al.

[11] Patent Number: 5,244,533
[45] Date of Patent: Sep. 14, 1993

[54] METHOD OF MANUFACTURING BIPOLAR TRANSISTOR OPERATED AT HIGH SPEED

[75] Inventors: Koji Kimura, Kawasaki; Shin-ichi Taka, Yokosuka, both of Japan

[73] Assignee: Kabushiki Kaisha Toshiba, Kawasaki, Japan

[21] Appl. No.: 815,786

[22] Filed: Jan. 2, 1992

[30] Foreign Application Priority Data

Jan. 7, 1991 [JP] Japan .......................................... 3-96
Dec. 25, 1991 [JP] Japan .................................. 3-343198

[51] Int. Cl.$^5$ ........................ H01L 21/265; B44C 1/22
[52] U.S. Cl. ....................................... 156/625; 437/31;
437/162; 437/909; 148/DIG. 10; 148/DIG. 124
[58] Field of Search ................ 437/31, 162, 909; 148/DIG. 10, DIG. 124; 156/625

[56] References Cited

U.S. PATENT DOCUMENTS 4,830,972 5/1989 Hamasaki ............................. 437/31
4,975,381 12/1990 Taka et al. ........................... 437/31
4,994,400 2/1991 Yamaguchi et al. ................. 437/31
4,996,581 2/1991 Hamasaki ............................. 437/31

FOREIGN PATENT DOCUMENTS 0082668 3/1989 Japan ..................................... 437/31

Primary Examiner—Brian E. Hearn
Assistant Examiner—Tuan Nguyen
Attorney, Agent, or Firm—Finnegan, Henderson, Farabow, Garrett & Dunner

[57] ABSTRACT

According to this invention, in a method of manufacturing a bipolar transistor, a first oxide film, a nitride film, a first polysilicon film containing boron, and a second oxide film are formed on a substrate. A first opening is formed in the second oxide film and the first polysilicon film. The nitride film and the first oxide film are etched in and near the first opening to form overhung portions between the substrate and the first semiconductor film around the first opening. A second polysilicon film for burying the overhung portions is formed on the entire surface of the resultant structure. Thereafter, boron in the second polysilicon film is thermally diffused in the substrate to form an external base region and a link region. The second polysilicon film is etched to leave the second polysilicon film at only the overhung portions. After an internal base region formed in the substrate. Thereafter, an emitter region formed in the internal base region.

8 Claims, 14 Drawing Sheets

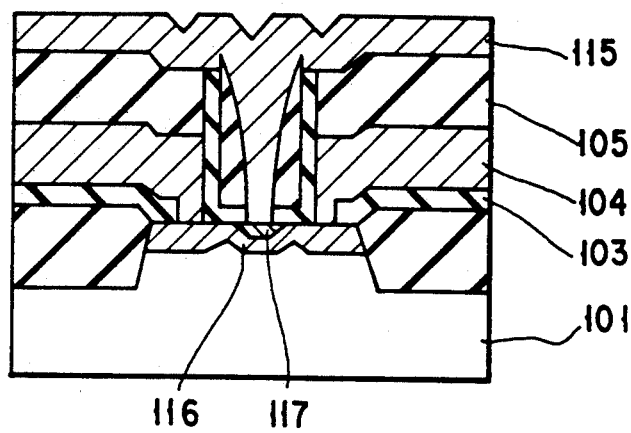
F I G. 11

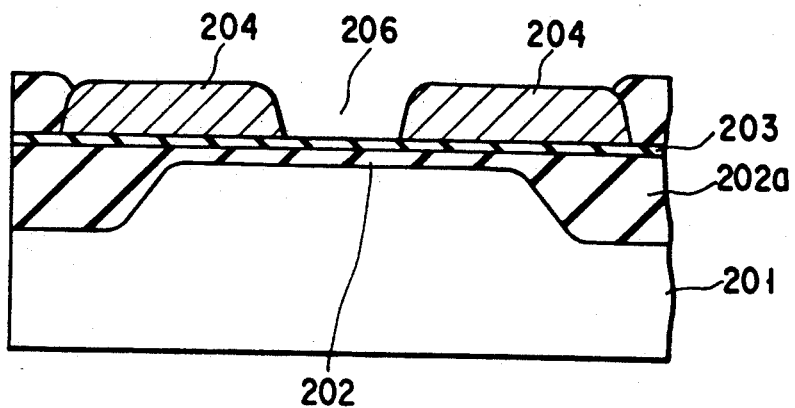
F I G. 2A
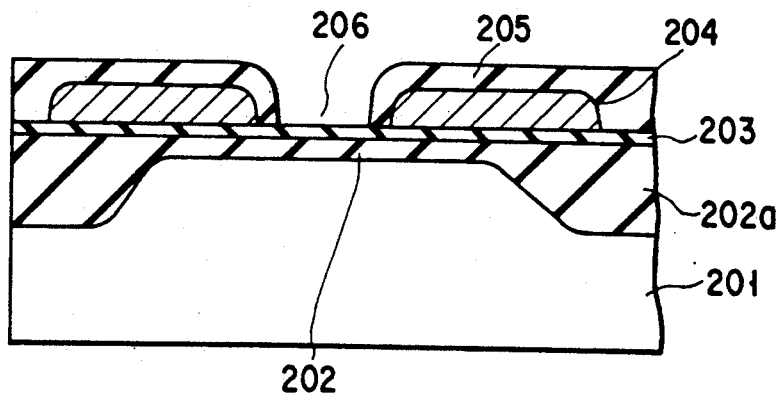
F I G. 2B

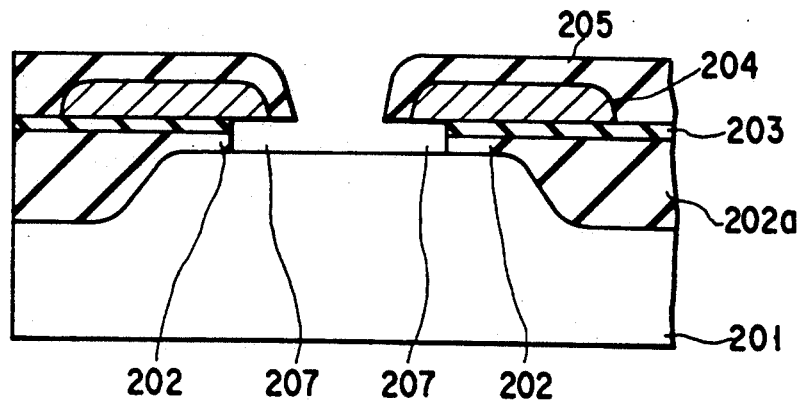
F I G. 2C
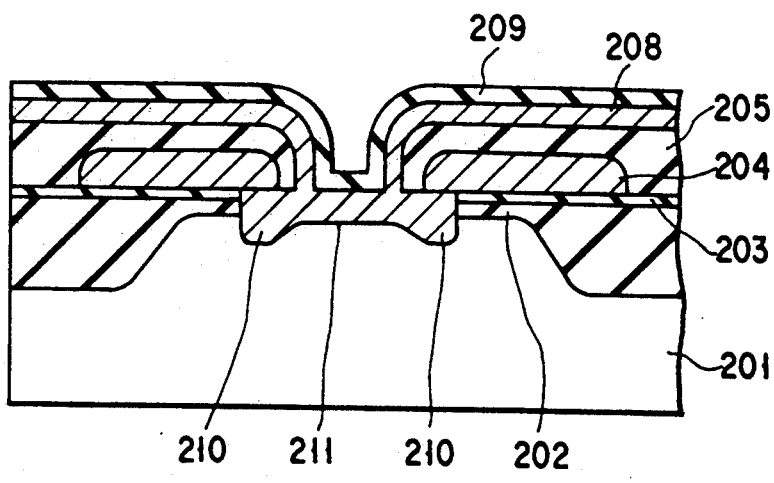
F I G. 2D

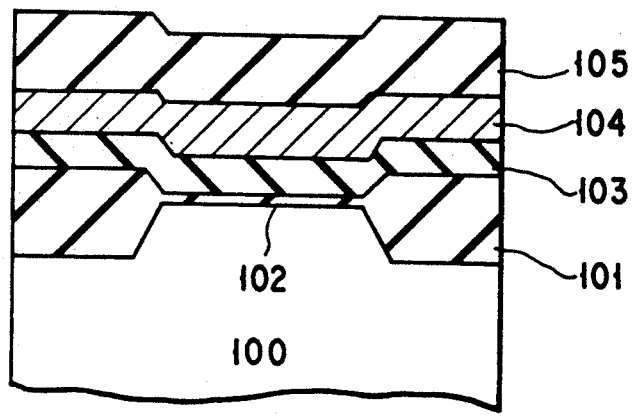
F I G. 3A
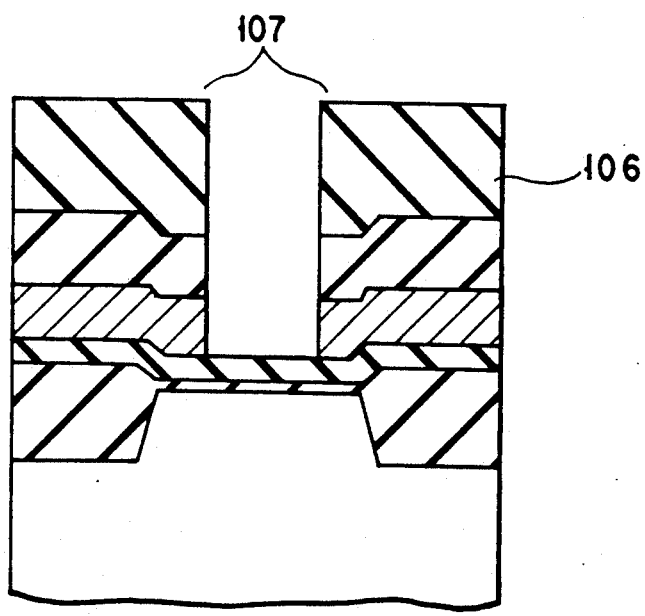
F I G. 3B

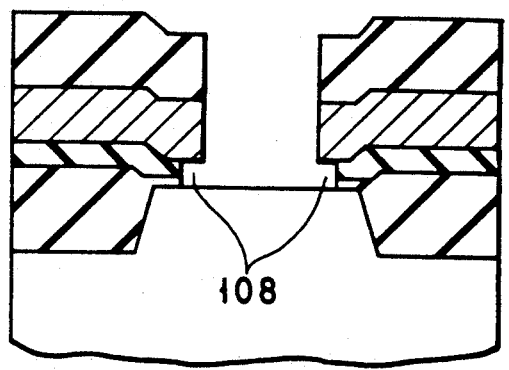
F I G. 3C
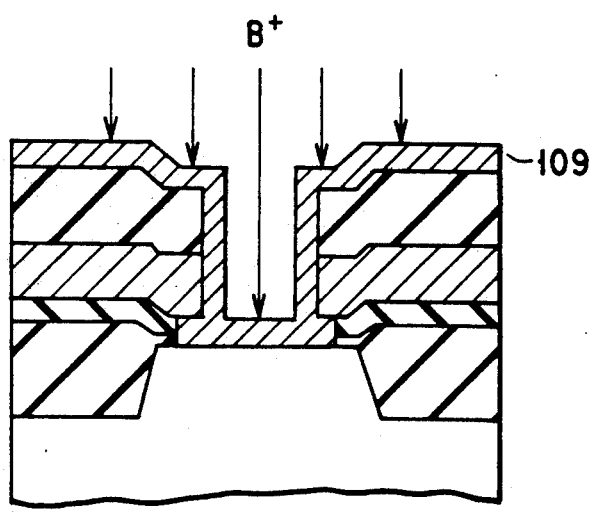
F I G. 3D

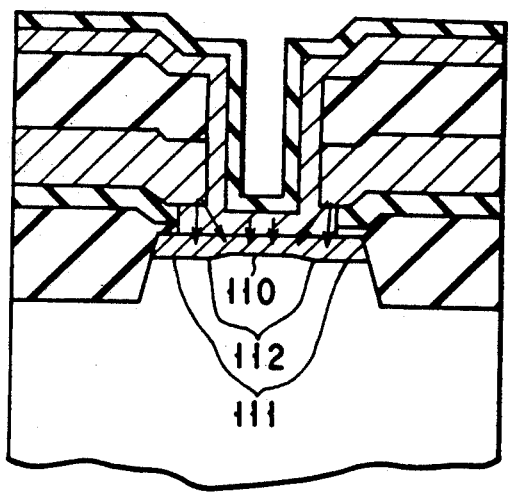
F I G. 3E
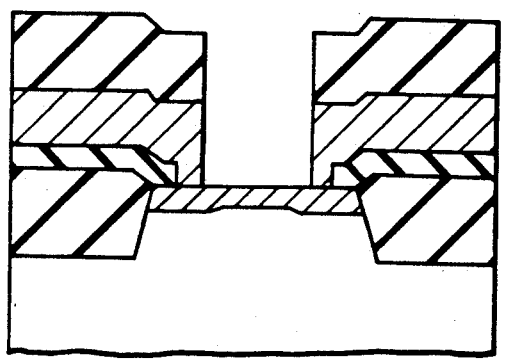
F I G. 3F

METHOD OF MANUFACTURING BIPOLAR TRANSISTOR OPERATED AT HIGH SPEED

BACKGROUND OF THE INVENTION

1. Field of the Invention

The present invention relates a method of manufacturing a bipolar transistor operated at a high speed.

2. Description of the Related Art

The base of a conventional self-aligned bipolar transistor is constituted by an internal base region, an external base region connected to a base electrode, and a link region for connecting the internal base region and the external base region to each other. In order to operate the bipolar transistor at a high speed, the link region is required to have a high impurity concentration, a predetermined small depth, and a low resistance.

In many cases, the link region is generally formed by an ion implantation method. Therefore, since ions implanted in a substrate are diffused by channeling, the depth of the link region cannot easily be set within a predetermined range.

In conventional technique, in order to set the depth of a link region within a predetermined range, the following methods are used. In the first method, a scattering layer for suppressing channeling and reducing the range of ions is formed in a substrate in advance. In the second method, the impurity concentration of a collector immediately below the link region is increased to suppress channeling, such that the effective implantation energy of the ions is decreased. In the third method, the surface of an internal base region is etched to relatively decrease the depth of the link region with respect to the internal base region.

These methods, however, have the following drawbacks. That is, in the first method, since the profile of the impurity of the link region plots a moderate curve from the surface portion of the substrate to the inner portion thereof, the link region obtained by locally forming a region having a high impurity concentration near the surface of the substrate cannot be formed. In the second method, since $BF_2+$ is used as an impurity, the characteristics of a transistor are degraded by F (fluorine). In addition, in the first and second methods, radiation damage caused by ion implantation is not inevitably avoided. Especially, the radiation damage is larger in the second method than in a method wherein B (boron) is used as an impurity. In the third method, the substrate cannot be easily etched with high accuracy, and an emitter width is changed in accordance with the depth of this etching.

SUMMARY OF THE INVENTION

The present invention has been made to solve the above drawbacks, and has as its objects to form a link region, having a predetermined depth, for connecting an internal base region and an external base region to each other without radiation damage in a substrate so as to decrease a resistance of the link region.

In order to achieve the object, a method of manufacturing a bipolar transistor according to the present invention comprises the following steps. That is, a first oxide film is formed on a substrate containing a first impurity of a first conductivity type, and a nitride film is formed on the first oxide film. A first semiconductor film containing a second impurity of a second conductivity type is formed on the nitride film, and a second oxide film is formed on the first semiconductor film. The second oxide film and the first semiconductor film are anisotropically etched to form a first opening. The nitride film and the first oxide film are etched in and near the opening to form overhung portions between the substrate and the first semiconductor film around the first opening. A second semiconductor film for burying the overhung portions is formed on the entire surface of the resultant structure. The second impurity in the first semiconductor film is diffused by thermal diffusion in the substrate through the second semiconductor film of the overhung portion to form an external base region and a link region. The second semiconductor film is etched to leave the second semiconductor film at only the overhung portions. After a third oxide film is formed on the entire surface of the resultant structure, a second opening reaching the substrate is formed in the third oxide film. A third semiconductor film is formed in the second opening, and a third impurity of the second conductivity type is implanted in the third semiconductor film. The third impurity in the third semiconductor film is thermally diffused in the substrate through the second opening to form an internal base region. A fourth impurity of the first conductivity type is implanted in the third semiconductor film. The impurity in the third semiconductor film is thermally diffused in the substrate through the second opening to form an emitter region in the internal base region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1I are sectional views showing a method of manufacturing a bipolar transistor according to an embodiment of the present invention;

FIGS. 2A to 2G are sectional views showing a method of manufacturing a bipolar transistor according to another embodiment of the present invention; and FIGS. 3A to 3J are sectional views showing a method of manufacturing a bipolar transistor according to still another embodiment of the present invention.

DETAILED DESCRIPTION OF THE PREFERRED EMBODIMENTS

Embodiments of the present invention will be described below with reference to the accompanying drawings.

Figure 1A:
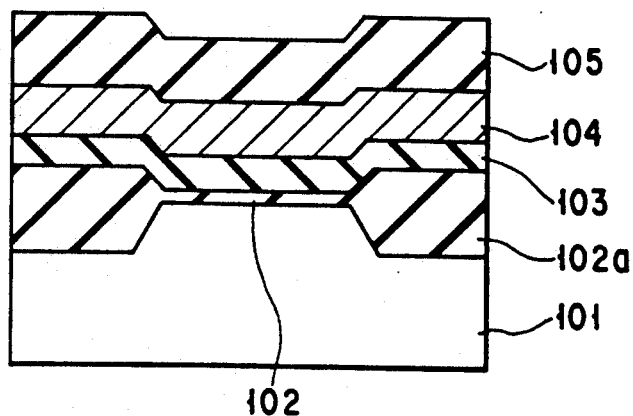

FIG. 1A to 1I show a method of manufacturing a bipolar transistor according to an embodiment of the present invention. As shown in FIG. 1A, a field oxide film 102 is formed by a selective oxidation method on the surface of a substrate 101 constituted by, e.g., an $n^+$-type region and an $n^-$-type region. An element region is surrounded by a field oxide film 102a. The oxide film 102 having a thickness of about 50 nm is formed in the element region. A nitride film 103 having a thickness of about 100 nm is formed on the entire surface of the resultant structure. A polysilicon film 104 having a thickness of about 400 nm is formed on the nitride film 103. B (boron) ions are implanted in the polysilicon film 104 by an ion implantation method at a dose of about $1 \times 10^{16}$ cm$^{-2}$. In this embodiment, a film made of a conductive material such as silicide having a low resistance may be used in place of the polysilicon film 104 in which boron ions are implanted. Thereafter, an oxide film 105 having a thickness of about 500 nm is formed on the polysilicon film 104 by a CVD method.

Figure 1B:
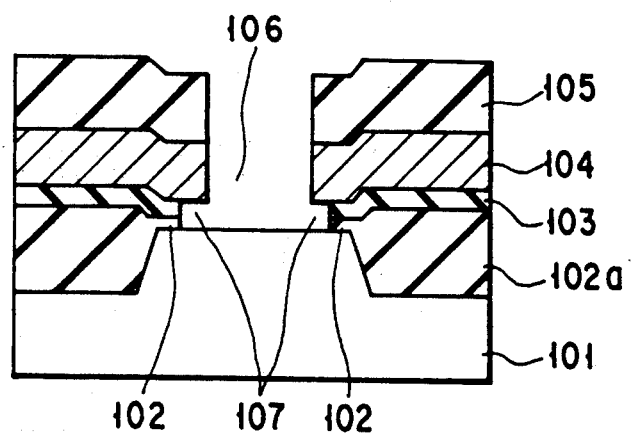

As shown in FIG. 1B, the oxide film 105 and the polysilicon film 104 are sequentially etched by anisotropic etching to form a square contact hole 106 having a width of, e.g., 1.0 μm. This contact hole 106 serves as an important parameter for determining the size of a transistor. Thereafter, the nitride film 103 is etched by a hot phosphoric acid solution having a temperature of 140° to 190° C. in a depth of about 0.35 μm. Subsequently, the oxide film 102 is etched to form overhung portions 107.

Figure 1C:
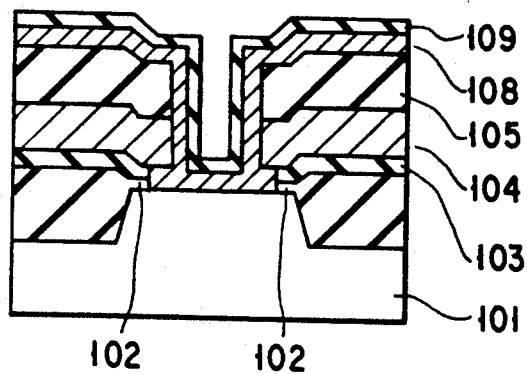

As shown in FIG. 1C, a polysilicon film 108 having a thickness of about 150 nm is formed by a CVD method to completely bury the overhung portions 107. An oxide film 109 is formed on the polysilicon film 108 by a CVD method.

Figure 1D:
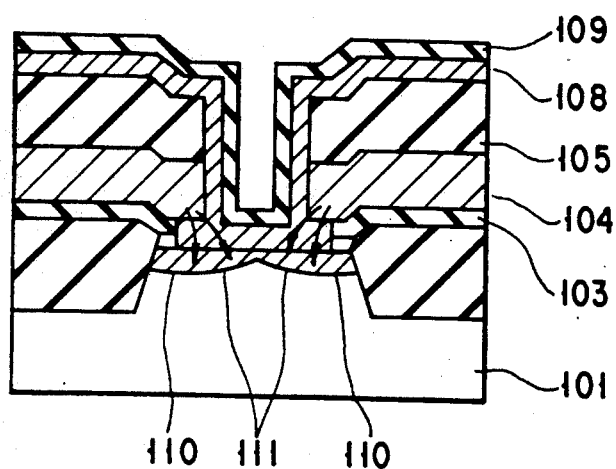

As shown in FIG. 1D, an external base region 110 and a link region 111 are simultaneously formed in the substrate 101 by thermal diffusion. The external base region 110 and the link region 111 are formed to be described below. That is, when annealing at a temperature of, e.g., 850° to 900° C. for about 30 min or RTA (rapid thermal anneal) at a temperature of 1,000° to 1,050° C. for 10 to 30 sec is performed as the thermal diffusion, since boron ions contained in the polysilicon film 104 pass through the polysilicon film 108 as indicated by arrows in FIG. 1D and is diffused in the substrate 101, the external base region 110 and the link region 111 are simultaneously formed. Since the distance between the polysilicon film 104 and the link region 111 is larger than the distance between the polysilicon film 104 and the external base region 110, a moving distance of the boron ions through the polysilicon film 108 is necessarily large. As a result, a link region which is shallower than the external base region 110 is formed.

Figure 1E:
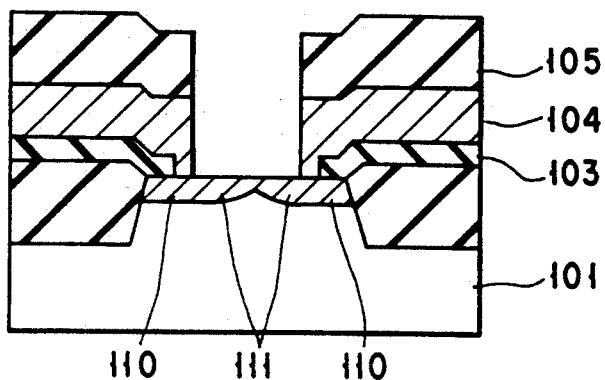
Figure 1F:
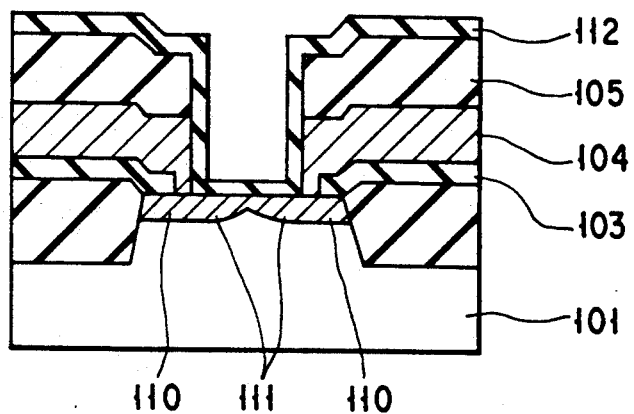
Figure 1G:
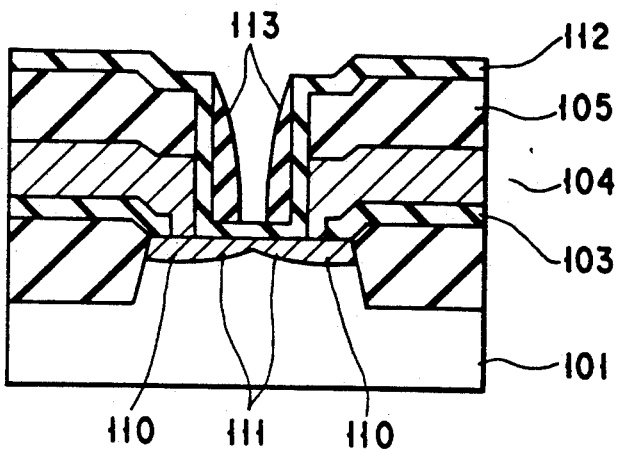
Figure 1H:
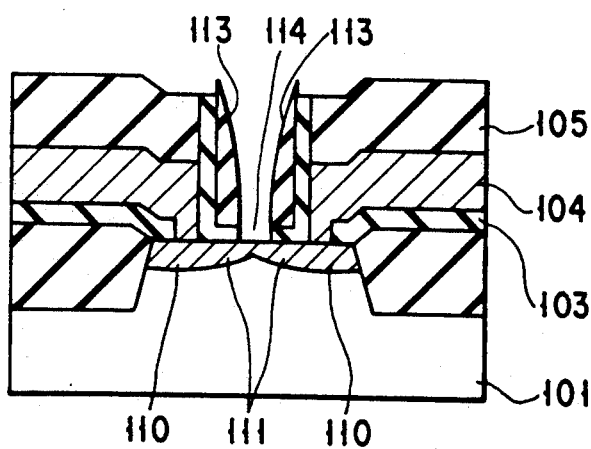

As shown in FIG. 1E, the polysilicon film 108 is isotropically etched to leave the polysilicon film 108 at only the overhung portions 107. As shown in FIG. 1F, an oxide film 112 having a thickness of about 150 nm is formed on the entire surface of the resultant structure by a CVD method. As shown FIG. 1G, a polysilicon film having a thickness of about 250 nm is formed on the oxide film 112 by a CVD method. Thereafter, the polysilicon film is anisotropically etched to form side walls 113 on the oxide film 112 in the contact hole 106. As shown in FIG. 1H, the oxide film 112 exposed on the surface of the resultant structure is removed by an anisotropic etching method to form a contact hole 114 on the substrate 101.

As shown in FIG. 1I, a polysilicon film 115 having a thickness of about 250 nm is formed on the entire surface of the resultant structure by a CVD method. An oxide film (not shown) is formed on the polysilicon film 115. Boron ions are implanted in the polysilicon film 115 by an ion implantation method at a dose of $5 \times 10^{14}$ cm$^{-2}$. Thereafter, annealing is performed at a temperature of, e.g., 950° C. for 30 to 90 min to cause the boron ions in the polysilicon film 115 to be diffused to the substrate 101, thereby forming an internal base region 116. At this time, the oxide film on the polysilicon film 115 suppresses channeling of the boron ions to prevent diffusion of the boron ions in an outer direction. After the oxide film formed on the polysilicon film 115 is removed, an oxide film (not shown) is formed on the polysilicon film 115 again. Arsenic (As) ions are implanted in the polysilicon film 115 by an ion implantation method at a dose of $1 \times 10^{16}$ cm$^{-2}$. Thereafter, RTA is performed at a temperature of, e.g., 1,000° to 1,050° C. for 10 to 30 sec to cause the arsenic ions in the polysilicon film 115 to be diffused to the substrate 101, thereby forming an emitter region 117. At this time, the oxide film on the polysilicon film 115 suppresses channeling of the boron ions to prevent diffusion of the boron ions in an outer direction. Thereafter, this oxide film is removed. Note that, in this embodiment, a film made of a conductive material such as silicide having a low resistance may be used in place of the polysilicon film 115.

Figure 2E:
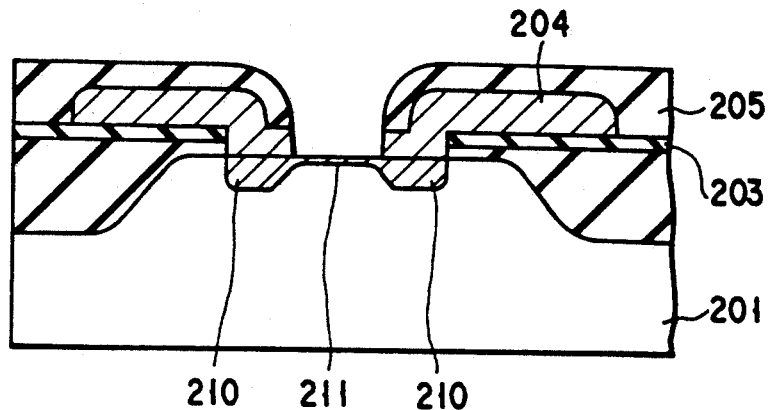

FIGS. 2A to 2G show a method of manufacturing a bipolar transistor according to another embodiment of the present invention. As shown in FIG. 2A, a field oxide film 202a is formed by a selective oxidation method on the surface of a substrate 101 constituted by, e.g., an n$^+$-type region and an n$^-$-type region. An element region is surrounded by the field oxide film 202a. An oxide film 202 having a thickness of about 50 nm is formed in the element region. A nitride film 203 having a thickness of about 100 nm is formed on the entire surface of the resultant structure. A polysilicon film 204 having a thickness of about 400 nm is formed on the nitride film 203. Boron (B) ions are implanted in the polysilicon film 204 by an ion implantation method at a dose of about $1 \times 10^{16}$ cm$^{-2}$. According to this embodiment, a film made of a conductive material such as silicide having a low resistance may be used in place of the polysilicon film 204 in which boron ions are implanted. Thereafter, the polysilicon film 204 is anisotropically etched, and a square contact hole 206 having a width of, e.g., about 1.0 μm, is formed. Note that the contact hole 206 serves as an important parameter for determining the size of a transistor.

As shown in FIG. 2B, an oxide film having a thickness of about 500 nm is formed on the polysilicon film 204 by a CVD method. As shown in FIG. 2C, the nitride film 203 is etched in a depth of about 0.35 μm by a hot phosphoric acid solution having a temperature of 140° to 190° C. Subsequently, the oxide film 202 is etched to form overhung portions 207.

As shown in FIG. 2D, a polysilicon film 208 having a thickness of about 150 nm is formed by a CVD method to completely bury the overhung portions 207. An oxide film 209 is formed on the polysilicon film 208 by a CVD method. Thereafter, an external base region 210 and a link region 211 are simultaneously formed in the substrate 201 by thermal diffusion. The external base region 210 and the link region 211 are formed to be described below. That is, when annealing at a temperature of, e.g., 850° to 900° C. for about 30 min or RTA (rapid thermal anneal) at a temperature of 1,000° to 1,050° C. for 10 to 30 sec is performed as the thermal diffusion, since boron ions contained in the polysilicon film 204 pass through the polysilicon film 208 and is diffused in the substrate 201, the external base region 210 and the link region 211 are simultaneously formed. Since the distance between the polysilicon film 204 and the link region 211 is larger than the distance between the polysilicon film 204 and the external base region 210, a moving distance of the boron ions through the polysilicon film 208 is necessarily large. As a result, a link region which is shallower than the external base region 210 is formed.

Figure 2F:
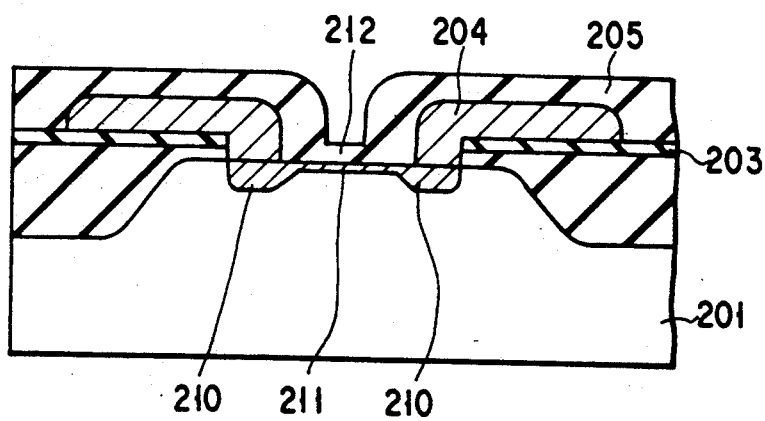

As shown in FIG. 2E, the polysilicon film 208 is isotropically etched to leave the polysilicon film 208 at the overhung portions 207. As shown in FIG. 2F, an oxide film 212 having a thickness of about 150 nm is formed on the entire surface of the resultant structure by a CVD method.

Figure 2G:
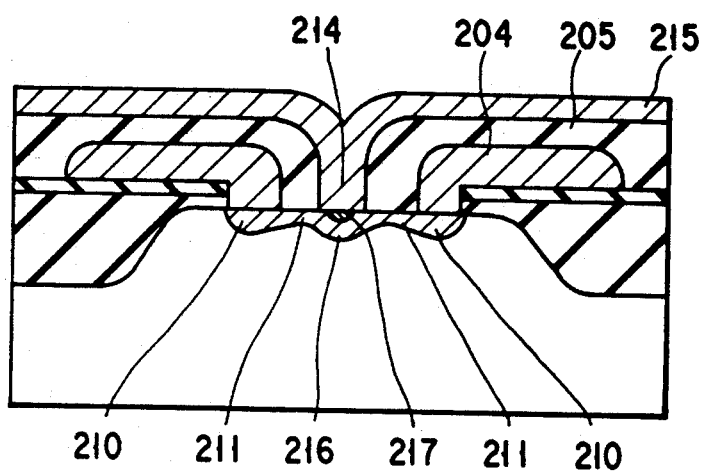

As shown in FIG. 2G, the oxide film 212 is removed by anisotropic etching to form a contact hole 214. A polysilicon film 215 having a thickness of about 250 nm is formed on the entire surface of the resultant structure by a CVD method. In addition, an oxide film having a thickness of about 100 nm is formed on the polysilicon film 215 by a CVD method. Boron ions are implanted in the polysilicon film 215 by an ion implantation method at a dose of about $5 \times 10^{14}$ cm$^{-2}$. Thereafter, annealing is performed at a temperature of about 950° C. for 30 to 90 min to cause the boron ions in the polysilicon film 215 to be diffused to the substrate 201, thereby forming an internal base region 206. At this time, the oxide film on the polysilicon film 215 suppresses channeling of the boron ions to prevent diffusion of the ions in an outer direction. After the oxide film formed on the olysilicon film 215 is removed, an oxide film (not shown) is formed on the polysilicon film 215 again. Arsenic (As) ions are implanted in the polysilicon film 215 by an ion implantation method at a dose of $1 \times 10^{16}$ cm$^{31}$ $^2$. Thereafter, RTA is performed at a temperature of, e.g., 1,000° to 1,050° C. for 10 to 30 sec to cause the arsenic ions in the polysilicon film 215 to be diffused to the substrate 201, thereby forming an emitter region 217. At this time, the oxide film on the polysilicon film 215 suppresses channeling of the boron ions to prevent diffusion of the ions in an outer direction. Thereafter, this oxide film is removed. In this embodiment, a film made of a conductive material such as silicide having a low resistance may be used in place of the polysilicon film 215.

In the above two embodiments, after the polysilicon film serving as an emitter electrode is formed, the internal base region is formed in the substrate by annealing. For this reason, the depth of the internal base region can be precisely controlled. However, a spontaneous oxide film on the surface of the polysilicon film is damaged by the annealing, and the polysilicon film is grown. At this time, projections are easily formed on the surface of the polysilicon film. The projections adversely affect impurity diffusion performed for forming an emitter region. Therefore, it is an object of the following embodiment to provide a method of manufacturing a bipolar transistor capable of solving the above problem and precisely controlling the depth of an emitter region. This embodiment is inferior to the above-described two embodiments in control of the depth of an internal base region or the like but is superior in control of the depth of an emitter region or the like. The content of this embodiment will be described below.

Figure 3G:
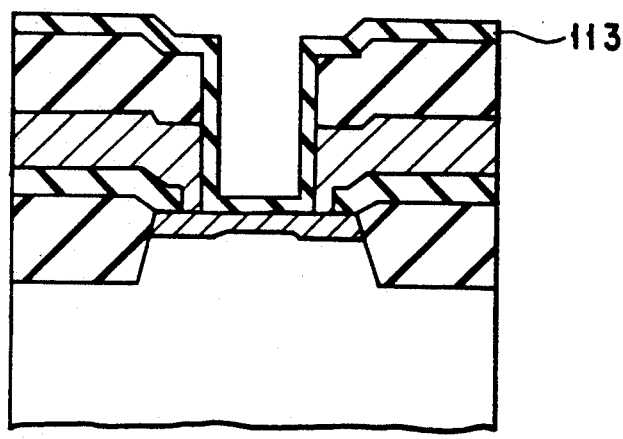

FIGS. 3A to 3J show a method of manufacturing a bipolar transistor according to still another embodiment of the present invention. As shown in FIG. 3A, a field oxide film 302a is formed by a selective oxidation method on the surface of a substrate 301 constituted by, e.g., an n$^+$-type region and an n$^-$-type region. As the selective oxidation method, a method using, e.g., a buffer oxide film and a nitride film as masks is used. The thickness of the field oxide film 302a is determined in consideration of a stray capacitance between the substrate and a base electrode and the planarity of the substrate surface. Although the field oxide film 302a may be buried in the substrate 301, the field oxide film 302a having a thickness of about 600 nm is formed on the substrate 301 in this embodiment.

An element region is surrounded by the field oxide film 302a. An oxide film 302 having a thickness of about 50 nm is formed in the element region. A nitride film 303 having a thickness of about 100 nm is formed on the entire surface of the resultant structure. A polysilicon film 304 having a thickness of about 400 nm is formed on the nitride film 303. Boron (B) ions are implanted in the olysilicon film 304 by an ion implantation method at a dose of $1 \times 10^{16}$ cm$^{-2}$. In this embodiment, in place of the polysilicon film 304 in which the boron ions are implanted, a film made of a conductive material such as silicide having a low resistance or a film made of a material having a polycrystalline or amorphous structure may be used. Thereafter, an oxide film 305 having a thickness of about 500 nm is formed on the polysilicon film 304 by a CVD method.

As shown in FIG. 3B, a resist film 306 is formed on the entire surface of the resultant structure. The resist film 306 is patterned to form an opening 307 in a region in which an emitter electrode is to be formed. Thereafter, the polysilicon film 304 is anisotropically etched using the resist film 306 as a mask. As a result, a square contact hole having a width of about 1.0 μm is formed. Since the contact hole serves as an important parameter for determining the size of a transistor, the contact hole is formed by the anisotropic etching method.

As shown in FIG. 3C, after the resist film 306 is removed, the nitride film 303 is laterally side-etched in a depth of about 0.35 μm by a hot phosphoric acid solution having a temperature of 140° to 190° C. Subsequently, the oxide film 302 is etched to form overhung portions 308.

As shown in FIG. 3D, a polysilicon film 309 having a thickness of about 150 nm is formed by a CVD method to completely bury the overhung portions 308. Thereafter, boron ions are implanted in the polysilicon film 309 by an ion implantation method at a dose of $1 \times 10^{14}$ cm$^{-2}$.

As shown in FIG. 3E, an oxide film 309a for preventing diffusion of boron ions to the air is formed on the polysilicon film 309 by a CVD method. Thereafter, an internal base region 310, an external base region 311, and a link region 312 are simultaneously formed in the substrate 301 by thermal diffusion. The internal base region 310, the external base region 311, and the link region 312 will be formed to be described below. That is, when annealing at a temperature of, e.g., 1,000° to 1,050° C. for about 10 to 30 min or RTA (rapid thermal anneal) in the same conditions as those of the annealing is performed as the thermal diffusion, boron ions contained in the polysilicon film 309 are diffused in the substrate 301 to form the internal base region 310 having a depth of about 0.10 to 0.15 μm. At the same time, boron ions contained in the polysilicon film 304 pass through the polysilicon film 309 and is diffused in the substrate 301 to form the external base region 311 and the link region 312. Since the distance between the polysilicon film 304 and the link region 312 is larger than the distance between the polysilicon film 304 and the external base region 311, a moving distance of the boron ions through the polysilicon film 309 is necessarily large. As a result, the link region 312 which is shallower than the external base region 311 is formed. Note that the depth of the link region 312 is changed in accordance with a change in diffusion coefficient of the boron in the polysilicon film 309.

As shown in FIG. 3F, after the oxide film 309a is removed, the polysilicon film 309 is isotropically etched to leave the polysilicon film 309 at the overhung portions 308. As shown in FIG. 3G, an oxide film 313 having a thickness of about 150 nm is formed on the entire surface of the resultant structure by a CVD method.

Figure 3H:
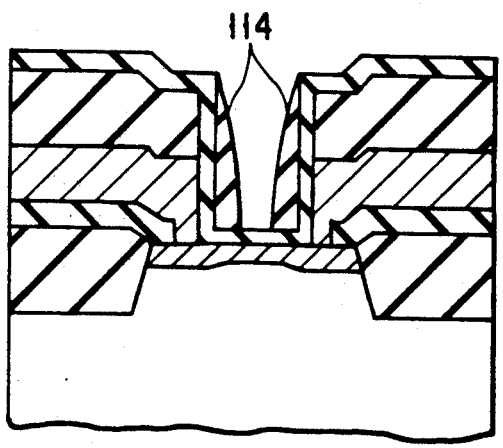

As shown in FIG. 3H, a polysilicon film 314 having a thickness of about 250 mn is formed on the oxide film 313 by a CVD method. The polysilicon film 314 is removed by anisotropic etching to form side walls 314a.

Figure 3I:
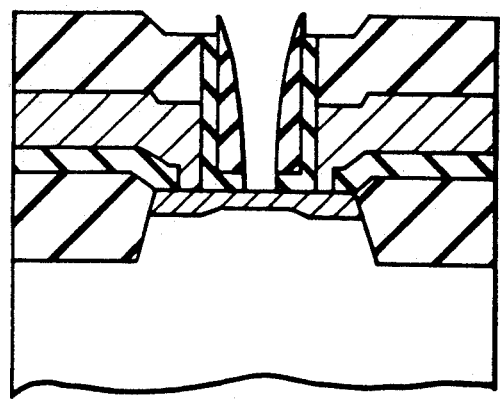
Figure 3J:
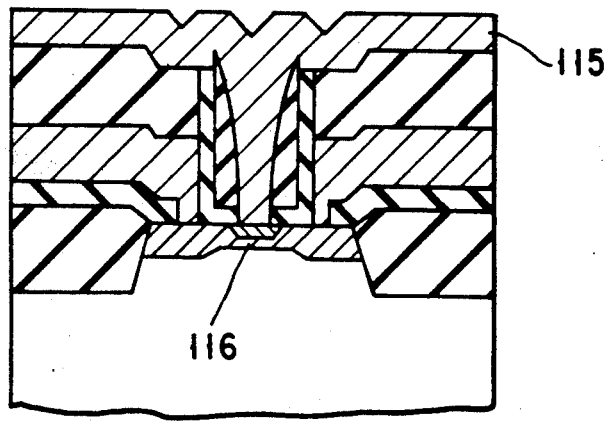

As shown in FIG. 3I, the oxide film 313 is removed by anisotropic etching to form a contact hole 313a. As shown in FIG. 3J, a polysilicon film 315 having a thickness of about 250 nm is formed on the entire surface of the resultant structure by a CVD method. In addition, an oxide film for preventing diffusion of an impurity in the air is formed on the polysilicon film 315 by a CVD method. Thereafter, arsenic (As) ions are implanted in the polysilicon film 315 by an ion implantation method at a dose of about $1 \times 10^{16} cm^{-2}$, and RTA is performed at a temperature of, e.g., 1,000° to 1,050° C. for 10 to 30 sec to cause the arsenic ions in the polysilicon film 315 to be diffused to the substrate 301, thereby forming an emitter region 316. At this time, the oxide film on the polysilicon film 315 suppresses channeling of the arsenic ions to prevent diffusion of the arsenic ions in an outer direction. This oxide film is removed, and the step of forming an insulating film and the step of forming wiring lines are generally performed, thereby obtaining a bipolar transistor.

In this embodiment, although the oxide film 305 is formed by a CVD method, the oxide film 305 may be formed by an SST method, i.e., by oxidizing the surface of the polysilicon film 304.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a bipolar transistor, comprising the steps of:
   forming a first oxide film on a substrate containing a first impurity of a first conductivity type;
   forming a nitride film on said first oxide film;
   forming a first semiconductor film containing a second impurity of a second conductivity type on said nitride film;
   forming a second oxide film on said first semiconductor film;
   anisotropically etching said second oxide film and said first semiconductor film to form a first opening;
   etching said nitride film and said first oxide film in and around said first opening and forming overhung portions between said substrate and said first semiconductor film around said first opening;
   forming a second semiconductor film for burying said overhung portions on an entire surface of a resultant structure;
   causing said second impurity in said first semiconductor film to be thermally diffused in said substrate through said second semiconductor film of said overhung portions to form an external base region and a link region;
   etching said second semiconductor film to leave said second semiconductor film at only said overhung portions;
   forming a third oxide film on an entire surface of a resultant structure;
   forming a second opening reaching said substrate in said third oxide film;
   forming a third semiconductor film containing a third impurity of the second conductivity type on said second opening;
   causing said third impurity in said third semiconductor film to be thermally diffused in said substrate through said second opening so as to form an internal base region;
   implanting a fourth impurity of the first conductivity type in said third semiconductor film; and
   causing said fourth impurity in said third semiconductor film to be thermally diffused in said substrate through said second opening so as to form an emitter region in said internal base region.

2. A method according to claim 1, wherein the step of forming said second opening comprises the step of anisotropically etching said third oxide film serving as a side wall of said first opening after a fourth semiconductor film is formed on said third oxide film.

3. A method according to claim 1, wherein said second and third impurities are boron, and said fourth impurity is arsenic.

4. A method of manufacturing a bipolar transistor, comprising the steps of:
   forming a first oxide film on a substrate containing a first impurity of a first conductivity type;
   forming a nitride film on said first oxide film;
   forming a first semiconductor film containing a second impurity of a second conductivity type on said nitride film;
   anisotropically etching said first semiconductor film to form a first opening;
   forming a second oxide film on a resultant structure;
   etching said nitride film and said first oxide film in and around said first opening and forming an overhung portion between said substrate and said first semiconductor film around said first opening;
   forming a second semiconductor film for burying said overhung portions on an entire surface of a resultant structure;
   causing said second impurity in said first semiconductor film to be thermally diffused in said substrate through said second semiconductor film of said overhung portions to form an external base region and a link region;
   etching said second semiconductor film to leave said second semiconductor film at only said overhung portions;
   forming a third oxide film on an entire surface of a resultant structure;
   forming a second opening reaching said substrate in said third oxide film;

forming a third semiconductor film containing a third impurity of the second conductivity type on said second opening;

causing said third impurity in said third semiconductor film to be thermally diffused in said substrate through said second opening so as to form an internal base region;

implanting a fourth impurity of the first conductivity type in said third semiconductor film; and causing said fourth impurity in said third semiconductor film to be thermally diffused in said substrate through said second opening so as to form an emitter region in said internal base region.

5. A method according to claim 4, wherein said second and third impurities are boron, and said fourth impurity is arsenic.

6. A method of manufacturing a bipolar transistor, comprising the steps of:

forming a first oxide film on a substrate containing a first impurity of a first conductivity type;

forming a nitride film on said first oxide film;

forming a first semiconductor film containing a second impurity of a second conductivity type on said nitride film;

forming a second oxide film on said first semiconductor film;

anisotropically etching said second oxide film and said first semiconductor film to form a first opening;

etching said nitride film and said first oxide film in and around first opening and forming overhung portions between said substrate and said first semiconductor film around said first opening;

forming a second semiconductor film for burying said overhung portions on an entire surface of a resultant structure;

implanting a third impurity of the second conductivity type in said second semiconductor film;

causing said second impurity in said first semiconductor film and said third impurity in said second semiconductor film to be thermally diffused in said substrate so as to form an external base region, a link region, and an internal base region;

etching said second semiconductor film to leave said second semiconductor film at only said overhung portions;

forming a third oxide film on an entire surface of a resultant structure;

forming a second opening reaching said substrate in said third oxide film;

forming a third semiconductor film in said second opening;

implanting a fourth impurity of the first conductivity type in said third semiconductor film; and causing said fourth impurity in said third semiconductor film to be thermally diffused in said substrate through said second opening so as to form an emitter region in said internal base region.

7. A method according to claim 6, wherein the step of forming said second opening comprises the step of anisotropically etching said third oxide film serving as a side wall of said first opening after a fourth semiconductor film is formed on said third oxide film.

8. A method according to claim 6, wherein said second and third impurities are boron, and said fourth impurity is arsenic.

* * * * *